(12) United States Patent
Thijssen et al.

(10) Patent No.: US 10,903,820 B2
(45) Date of Patent: Jan. 26, 2021

(54) SYSTEMS AND METHODS FOR ANALOG FINITE IMPULSE RESPONSE FILTERS

(71) Applicant: Analog Devices International Unlimited Company, County Limerick (IE)

(72) Inventors: Bartholomeus Jacobus Thijssen, Enschede (NL); Eric Antonius Maria Klumperink, Lichtenvoorde (NL); Philip Eugene Quinlan, Cork (IE); Bram Nauta, Borne (NL)

(73) Assignee: Analog Devices International Unlimited Company, County Limerick (IE)

( * ) Notice: Subject to any disclaimer, the term of this patent is extended or adjusted under 35 U.S.C. 154(b) by 0 days.

(21) Appl. No.: 16/838,250

(22) Filed: Apr. 2, 2020

(65) Prior Publication Data

US 2020/0321943 A1   Oct. 8, 2020

Related U.S. Application Data

(60) Provisional application No. 62/829,266, filed on Apr. 4, 2019, provisional application No. 62/896,660, filed on Sep. 6, 2019.

(51) Int. Cl.
*H03M 1/06* (2006.01)
*H03H 15/00* (2006.01)

(52) U.S. Cl.
CPC .......... *H03H 15/00* (2013.01); *H03M 1/0629* (2013.01)

(58) Field of Classification Search
CPC .. H03H 15/00; H03M 1/0629; H03M 1/0631; H03M 1/0626
See application file for complete search history.

(56) References Cited

U.S. PATENT DOCUMENTS 10,367,477 B2 * 7/2019 Lamb ................. H03H 17/0225

OTHER PUBLICATIONS

Fujishima et al. "Low-Power 1/2 Frequency Dividers Using 0.1-μm CMOS Circuits Built with Ultrathin SIMOX Substrates" IEEE Journal of Solid-State Circuits, vol. 28. No. 4, Apr. 1993 in 3 pages.

(Continued)

*Primary Examiner* — Jung Kim
(74) *Attorney, Agent, or Firm* — Knobbe, Martens, Olson & Bear, LLP

(57) ABSTRACT

Systems and methods for analog finite impulse response (FIR) filters are provided. In certain embodiments, a receiver includes a cascade of a mixer, an analog FIR filter, and an analog-to-digital converter (ADC). By including the analog FIR filter along the signal path between the mixer and the ADC, design constraints of the ADC are relaxed. For example, the ADC can operate with relaxed specifications with respect to resolution and/or dynamic range when the analog FIR filter is included. The analog FIR filter can include a controllable transconductance circuit that delivers an integration current to a capacitor over an integration period, with the analog FIR filter's coefficients used to change the transconductance setting of the controllable transconductance circuit to different values over the integration period.

20 Claims, 12 Drawing Sheets

(56) References Cited

OTHER PUBLICATIONS

Hameed et al. "A Time-Interleaved Filtering-by-Aliasing Receiver Front-End with >70dB Suppression at <4×Bandwidth Frequency Offset" 2017 IEEE International Solid-State Circuits Conference in 3 pages.

Huang et al. "A 58.9-dB ACR, 85.5-dB SBA, 5-26-MHz Configurable-Bandwidth, Charge-Domain Filter in 65-nm CMOS" IEEE Journal of Solid State Circuits, vol. 48, No. 11, Nov. 2013 in 12 pages.

Karvonen et al. "A CMOS Quadrature Charge-Domain Sampling Circuit With 66-dB SFDR Up to 100 MHz" IEEE Transaction on Circuits and Systems—I: Regular Papers, vol. 52, No. 2, Feb. 2005.

Mincey et al. "A 128-Tap Highly Tunable CMOS IF Finite Impulse Response Filter for Pulsed Radar Applications" IEEE Transactions on Very Large Scale Integration (VLSI) Systems, vol. 26, No. 6, Jun. 2018 in 12 pages.

Murphy et al. "A Blocker-Tolerant Wideband Noise-Cancelling Receiver with a 2dB Noise Figure" 2012 IEEE International Solid-State Circuits Conference in 3 pages.

O'hAnnaidh et al. "A 3.2GHz-Sample-Rate 800MHz Bandwidth Highly Reconfigurable Analog FIR Filter in 45nm CMOS" 2010 IEEE International Solid-State Circuits Conference in 3 pages.

Razavi et al. "Design of High-speed, Low-Power Frequency Dividers and Phase-Locked Loops in Deep Submicron CMOS" IEEE Journal of Solid-State Circuits, vol. 30, No. 2, Feb. 1995 in 9 pages.

Sinha et al. "A Sharp Programmable Passive Filter based on Filtering by Aliasing" 2015 Symposium on VLSI Circuits Digest of Technical Papers in 2 pages.

Thijssen et al. "A 0.06-3.4-MHz 92-µW Analog FIR Channel Selection Filter With Very Sharp Transition Band for IoT Receivers" IEEE Solid State Circuits Letters, vol. 2. No. 9, Sep. 2019 in 4 pages.

Thijssen et al. "A 370 µW 5.5dB-NF BLE/BT5.0/IEEE 802.15.4-Compliant Receiver with >63dB Adjacent Channel Rejection at >2 Channels Offset in 22nm FDSOI" 2020 IEEE International Solid-State Circuits Conference in 3 pages.

Thijssen et al. "Low-Power Highly Selective Channel Filtering Using a Transconductor-Capacitor Analog FIR" IEEE Journal of Solid-State Circuits, vol. 55, No. 7, Jul. 2020 in 11 pages.

* cited by examiner

SYSTEMS AND METHODS FOR ANALOG FINITE IMPULSE RESPONSE FILTERS

CROSS-REFERENCE TO RELATED APPLICATIONS

The present application claims priority to U.S. Provisional Patent Application No. 62/896,660, filed Sep. 6, 2019, and titled "LOW POWER RECEIVER TECHNIQUES," and to U.S. Provisional Patent Application No. 62/829,266, filed Apr. 4, 2019, and titled "TRANSCONDUCTOR-CAPACITOR AND RESISTOR-CAPACITOR ANALOG FIR FILTERS," each of which is hereby incorporated herein by reference in its entirety.

FIELD OF THE DISCLOSURE

Embodiments of the invention relate to electronics, and more particularly to, analog finite impulse response (FIR) filters and electronic systems including analog FIR filters.

BACKGROUND

Filters are used in a wide variety of applications to filter the frequency content of electronic signals. For example, in receivers for wireless electronics (for instance, Internet-of-Things devices), filters can aid in achieving sufficient signal-to-noise ratio (SNR) for low power consumption and/or to provide filtering with strong rejection and sharp transition band to provide channel selection.

SUMMARY OF THE DISCLOSURE

Systems and methods for analog finite impulse response (FIR) filters are provided. In certain embodiments, a receiver includes a cascade of a mixer, an analog FIR filter, and an analog-to-digital converter (ADC). By including the analog FIR filter along the signal path between the mixer and the ADC, design constraints of the ADC are relaxed. For example, the ADC can operate with relaxed specifications with respect to resolution and/or dynamic range when the analog FIR filter is included. The analog FIR filter can include a controllable transconductance circuit that delivers an integration current to a capacitor over an integration period, with the analog FIR filter's coefficients used to change the transconductance setting of the controllable transconductance circuit to different values over the integration period.

In one aspect, a receiver with analog finite impulse response filtering is provided. The receiver includes a mixer configured to downconvert a receive signal to generate a downconverted signal, and an analog FIR filter configured to filter the downconverted signal to generate a filtered signal. The analog FIR filter includes a controllable integrator having an integration current that is generated based on a plurality of filter coefficients of the analog FIR filter. The receiver further includes an ADC configured to digitize the filtered signal.

In another aspect, a method of receiving signals is provided. The method includes downconverting a receive signal to generate a downconverted signal using a mixer and filtering the downconverted signal to generate a filtered signal using an analog FIR filter, including generating an integration current based on a plurality of filter coefficients of the analog FIR filter. The method further includes digitizing the filtered signal using an ADC.

In another aspect, a semiconductor die is provided. The semiconductor die includes a memory configured to store a plurality of filter coefficients, and an analog FIR filter configured to filter an input signal to generate a filtered signal. The analog FIR filter includes a controllable integrator having an integration current that is generated based on the plurality of filter coefficients. The semiconductor die further includes an ADC configured to digitize the filtered signal.

DETAILED DESCRIPTION

Figure 1:
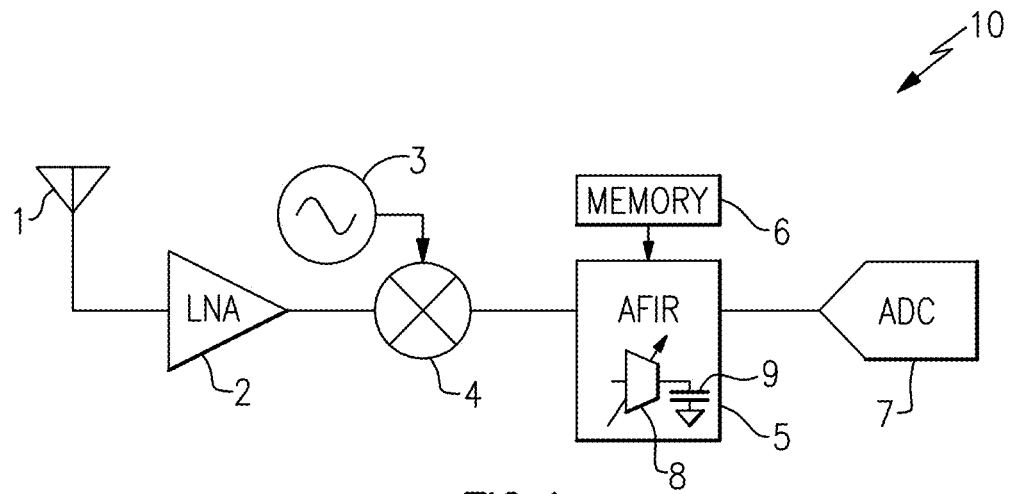
FIG. 1 is a schematic diagram of a receiver according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of a receiver 10 according to one embodiment. The receiver 10 includes an antenna 1, a low noise amplifier (LNA) 2, a local oscillator (LO) 3, a mixer 4, an analog FIR filter 5, a memory 6, and an analog-to-digital converter (ADC) 7. The analog FIR filter 5 can be implemented in accordance with any of the embodiments of analog FIR filters disclosed herein.

In the illustrated embodiment, the antenna 1 receives a radio frequency (RF) receive signal, which is amplified by the LNA 2 to generate an amplified receive signal. The mixer 4 receives the amplified receive signal and an LO signal from the LO 3, and uses the LO signal to downconvert the RF receive signal to baseband or intermediate frequency (IF). In certain implementations, the receiver 10 is implemented as a zero-IF receiver.

Although one embodiment of a receiver is depicted, the teachings herein are applicable to receivers implemented in other ways. Furthermore, although depicted in the context of a wireless receiver, analog FIR filters can be used in other applications of electronics systems, including, but not limited to, analog signal processing systems, data converters, and/or wired communication systems.

As shown in FIG. 1 the analog FIR filter 5 filters the downconverted signal from the mixer 4 to generate a filtered signal that is digitized by the ADC 7. A number of advantages are provided by including the analog FIR filter 5 between the mixer 4 and the ADC 7 in the signal path of the receiver 10. For example, including the analog FIR filter 5 provides high selectivity filtering that relaxes design constraints of the ADC 7, such as the ADC's dynamic range, sample rate, and/or resolution. Moreover, including the analog FIR filter 5 aids in reducing power consumption of the receiver 10. In certain implementations, the ADC 7 is a multi-bit converter with high resolution. However, other implementations are possible, including implementations in which the ADC 7 is a 1-bit ADC (for instance, a limiter).

Furthermore, the receiver 10 operates with high flexibility arising from the configurability of the analog FIR filter 5. For example, the analog FIR filter 5 receives FIR filter coefficients from the memory 8. Furthermore, in certain implementations, the memory 8 stores settings for controlling an operating frequency of the analog FIR filter 5. Thus by programming filter operating frequency and/or different FIR filter coefficients in the memory 8 (for instance, using a serial interface or bus), the filtering characteristics of the analog FIR filter 5 can be controlled. Such flexibility provides a number of advantages, such as an ability to change filter bandwidth over time and/or an ability to adjust filtering characteristics to account for process, temperature, and/or voltage (PVT) variation.

The filter coefficients can be unipolar (for instance, all filter coefficients having the same sign) or bipolar (for instance, a first portion of the filter coefficients having positive value and a second portion of the coefficients having negative value). For example, using bipolar coefficients allows a wide range of FIR filter transfer functions to be realized.

The illustrated analog FIR filter 5 can also be implemented using a common semiconductor fabrication process (for instance, complementary metal oxide semiconductor or CMOS) with other components of the receiver 10, thereby enhancing integration. In contrast, certain filtering structures, such as acoustic wave filters and/or passive filters implemented using surface mount components, are implemented off-chip and thus are associated with less integration.

Although depicted as being directly connected between the mixer 4 and the ADC 7, in certain implementations one or more additional components are included before and/or after the analog FIR filter 5. In a first example, a low pass filter is included between the mixer 4 and the analog FIR filter 5 to serve as a pre-filter to suppress aliasing. In a second example, a transimpedance amplifier is included between the mixer 4 and the analog FIR filter 5 to serve as a current to voltage converter. In certain implementations, the transimpedance amplifier includes a low pass filter.

In certain embodiments, the analog FIR filter 5 includes a controllable integrator including an integration current adjusting circuit 8 and a capacitor 9. Additionally, the filter coefficients in the memory 6 are used to adjust the integration current adjusting circuit 8. In certain implementations, the integration current adjusting circuit 8 is implemented using at least one of controllable transconductance cells or controllable resistors. For example, the integration current adjusting circuit 8 can correspond to a transconductance digital-to-analog converter (DAC) including selectable transconductance cells operating in parallel with one another to control the current provided to the capacitor 9 for integration.

The analog FIR filter 5 provides very sharp filter transition and good out-of-band rejection, and is suitable for providing channel filtering for the receiver 10. In accordance with the teachings herein, the analog FIR filter 5 can be implemented efficiently by realizing that output sample rate need not equal input sample rate, and that as the analog FIR filter 5 removes unwanted signal components (outside the filter bandwidth) the filtered signal can be downsampled without corruption by aliasing.

Figure 2:
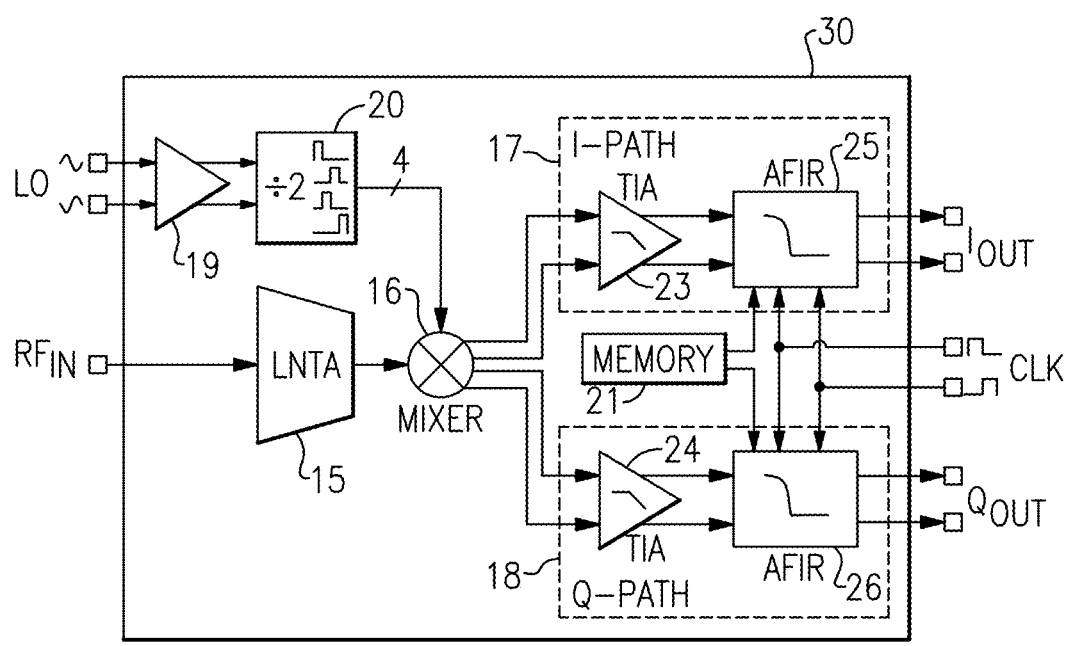
FIG. 2 is a schematic diagram of one embodiment of a semiconductor die including a receiver.

FIG. 2 is a schematic diagram of one embodiment of a semiconductor die 30 including a receiver. The semiconductor die 30 includes a low noise transimpedance amplifier (LNTA) 15, a mixer 16, an in-phase (I) phase path 17, a quadrature-phase (Q) path 18, an LO buffer 19, a quadrature divider 20, and a memory 21. The semiconductor die 30 further includes a variety of pins or pads including a pair of LO pins for receiving a differential LO signal, an RF input signal pin for receiving an RF input signal $RF_{IN}$, a pair of clock pins for receiving a low frequency differential clock signal CLK, a pair of I output pins for outputting a differential I output signal $I_{OUT}$, and a pair of Q output pins for outputting a differential Q output signal $Q_{OUT}$.

In the illustrated embodiment, the I path 17 includes an I-path transimpedance amplifier 23 and an I-path analog FIR filter 25. Additionally, the Q path 18 includes a Q-path transimpedance amplifier 24 and a Q-path analog FIR filter 26.

Although one embodiment of a semiconductor die with analog FIR filters is depicted, the teachings herein are applicable to semiconductor dies implemented in other ways. Furthermore, although the depicted I and Q paths are implemented differentially to provide enhanced rejection of common-mode noise, the teachings herein are also applicable to implementations using single-ended signaling.

In the illustrated embodiment, the LO buffer 19 buffers the differential LO signal to generate a buffered LO signal that is provided to the quadrature divider 20 for division. The quadrature divider 20 serves to generate four quadrature clock signals separated from one another by about 90° degrees and spanning the full 360° phase range. The quadrature divider 20 can be implemented in a variety of ways, including any of the embodiments of quadrature dividers disclosed herein.

The LNTA 15 amplifies the RF input signal $RF_{IN}$ to generate an amplified RF input signal that is provided to the mixer 16. The mixer 16 uses the quadrature clock signals from the quadrature divider 20 to downconvert and separate the amplified RF input signal into a differential input I signal and a differential input Q signal, which are quadrature signals having a phase different of about 90°. The I-path transimpedance amplifier 23 amplifies the differential input I signal to generate a differential amplified I signal, which is filtered by the I-path analog FIR filter 25 to generate the differential output I signal $I_{OUT}$. The filtering provided by the I-path analog FIR filter 25 is controlled by FIR filter coefficients in the memory 21 and a frequency of the differential clock signal CLK.

With continuing reference to FIG. 2, the Q-path transimpedance amplifier 24 amplifies the differential input Q signal to generate a differential amplified Q signal, which is filtered by the Q-path analog FIR filter 26 to generate the differential output Q signal $Q_{OUT}$. The filtering provided by the Q-path analog FIR filter 26 is controlled by FIR filter coefficients in the memory 21 and the frequency of the differential clock signal CLK.

In certain implementations, the differential clock signal CLK is generated on-chip and has an oscillation frequency controlled by data stored in the memory 21. For example, the semiconductor die 30 can include a phase-locked loop (PLL) or other frequency synthesizer for generating the differential clock signal CLK and having an output frequency controlled based on data stored in the memory 21. By providing a mechanism to control the operating frequency of analog FIR filters, enhanced flexibility in controlling filtering characteristics is achieved. The memory 21 can be any suitable memory, including not only volatile memory such as random access memory (RAM), but also non-volatile memory such as flash memory, fuses, and/or read only memory (ROM).

Although depicted as outputting the differential output I signal $I_{OUT}$ and the differential Q signal $Q_{OUT}$ (for instance, to a separate data converter chip), the teachings herein are also applicable to implementations in which one or more analog FIR filters are implemented on-chip with one or more ADCs.

Figure 3A:
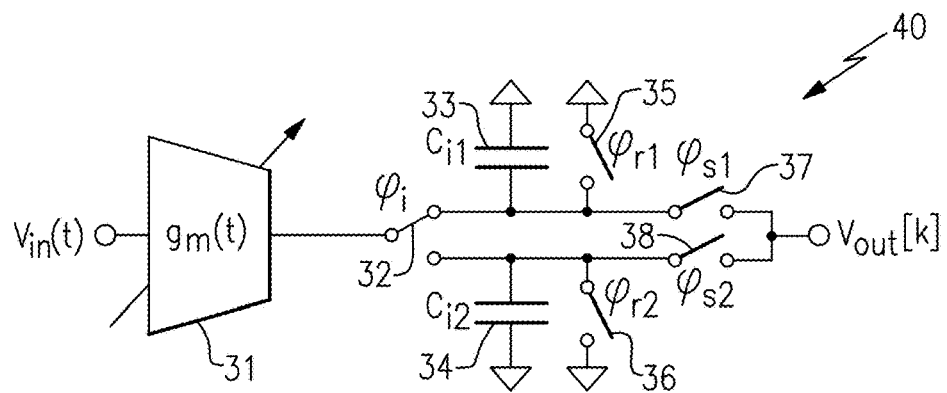
FIG. 3A is a schematic diagram of an analog finite impulse response (FIR) filter according to one embodiment.

FIG. 3A is a schematic diagram of an analog FIR filter 40 according to one embodiment. The analog FIR filter 40 includes a controllable transconductance circuit 31, an integration path selection switch 32 (controlled by an integration clock signal $\varphi_i$), a first integration capacitor 33 ($C_{i1}$), a second integration capacitor 34 ($C_{i2}$), a first reset switch 35 (controlled by a first reset clock signal $\varphi_{r1}$), a second reset switch 36 (controlled by a second reset clock signal $\varphi_{r2}$), a first output sampling switch 37 (controlled by a first output sampling clock signal $\varphi_{s1}$), and a second output sampling switch 38 (controlled by a second output sampling clock signal $\varphi_{s2}$).

As shown in FIG. 3A, the analog FIR filter 40 includes an input terminal that receives an input voltage signal $v_{in}(t)$, which is time varying. The controllable transconductance circuit 31 operates to convert the input voltage signal $v_{in}(t)$ into an integration current, which is provided to the integration path selection switch 32.

In the illustrated embodiment, the analog FIR filter 40 includes a first integration path from a first output of the integration path selection switch 32 to the first output sampling switch 37, and a second integration path from a second output of the integration path selection switch 32 to the second output sampling switch 38. The first integration capacitor 33 and the first reset switch 35 are in shunt to the first integration path, while the second integration capacitor 34 and the second reset switch 36 are in shunt to the second integration path.

When the first integration path is selected by the integration path selection switch 32, the integration current from the controllable transconductance circuit 31 is provided to the first integration capacitor 33. Additionally, when the second integration path is selected by the integration path selection switch 32, the integration current from the controllable transconductance circuit 31 is provided to the second integration capacitor 34. Furthermore, when the first output sampling switch 37 is closed, the first integration capacitor 33 is connected to the output terminal of the analog FIR filter 40, which provides an output voltage $v_{out}[k]$. Additionally, when the second output sampling switch 38 is closed, the second integration capacitor 34 is connected to the output terminal of the analog FIR filter 40.

Figure 3B:
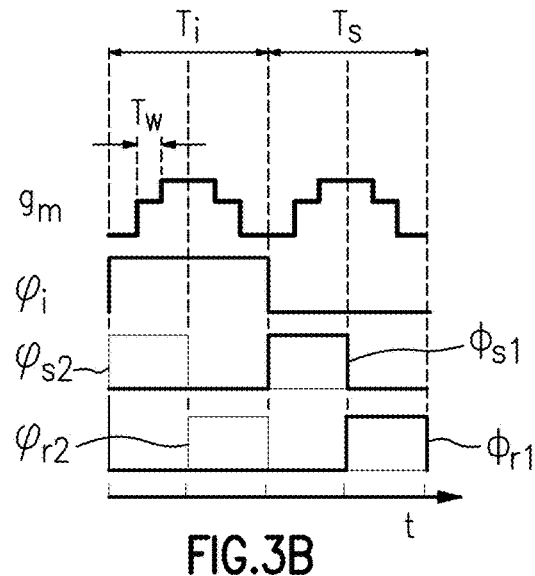
FIG. 3B is one example of a timing diagram for the analog FIR filter of FIG. 3A.

FIG. 3B is one example of a timing diagram for the analog FIR filter 40 of FIG. 3A. As shown in FIG. 3B, waveforms are included for the transconductance ($g_m$) setting of the controllable transconductance circuit 31, the integration clock signal $\varphi_i$, the first output sampling clock signal $\varphi_{s1}$, the second output sampling clock signal $\varphi_{s2}$, the first reset clock signal $\varphi_{r1}$, and the second reset clock signal $\varphi_{r2}$.

The timing diagram is depicted for an example in which the analog FIR filter 40 is implemented with six taps (6-tap). The $g_m$ setting of the controllable transconductance circuit 31 is changed over time to provide the FIR filter weights (as indicated by the filter coefficients) with a weight update period $T_w$.

With reference to FIGS. 3A and 3B, with respect to the first integration path, the first integration capacitor 33a begins discharged, and the output current from the controllable transconductance circuit 31 is summed on the first integration capacitor 33a for an integration period $T_i$ set by the integration clock signal $\varphi_i$. Additionally, the output is sampled (thereby controlling the output voltage $v_{out}[k]$) based on timing controlled by the first output sampling clock signal $\varphi_{s1}$. Thereafter, the voltage across the first integration capacitor 33a is reset using the first reset clock signal $\varphi_{r1}$.

After completion of the integration cycle for the first integration path, a similar process occurs for the second integration path. By using two integration capacitors, continuous integration of the input and read-out (sampling) at the output is performed.

In the illustrated embodiment, the $g_m$ setting of the controllable transconductance circuit 31 is changed with shorter weight update period $T_w$ (and thus with a higher frequency or rate) relative to an integration period $T_i$ in which current is integrated on a selected integration capacitor. Additionally, the $g_m$ setting of the controllable transconductance circuit 31 is also changed with a shorter weight update period $T_w$ (and thus with a higher rate) than an output sample period ($T_s$) in which a selected integration capacitor is connected to the output terminal. Although FIG. 3B depicts an implementation in which the integration period $T_i$ and the output sample period $T_s$ are equal, other implementations are possible. For example, in implementations including time-interleaved branches of controllable integrators, the output sample period $T_s$ can be smaller (corresponding to a higher output sampling rate) than the integration period $T_i$.

Figure 3C:
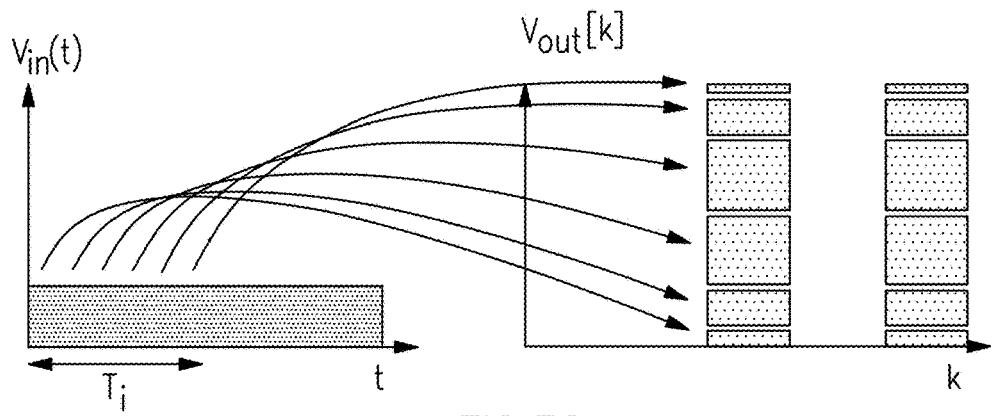
FIG. 3C is one example of graphs depicting operation of the analog FIR filter of FIG. 3A.

FIG. 3C is one example of graphs depicting operation of the analog FIR filter 40 of FIG. 3A.

The graphs of FIG. 3C include a first graph of voltage versus time for the input voltage $v_{in}(t)$, which is constant across the depicted time window in this example. As shown in FIG. 3C, different integrations associated with different $g_m$ settings (corresponding to different filter coefficients) occur across a given integration period $T_i$. The graphs of FIG. 3C further include a second graph of the output voltage $v_{out}[k]$ versus output sampling index k. As shown in FIG. 3C, for a given output sampling index, the output voltage $v_{out}[k]$ is based on a sum of different integrations associated with different $g_m$ settings occurring across the integration period $T_i$.

Figure 4A:
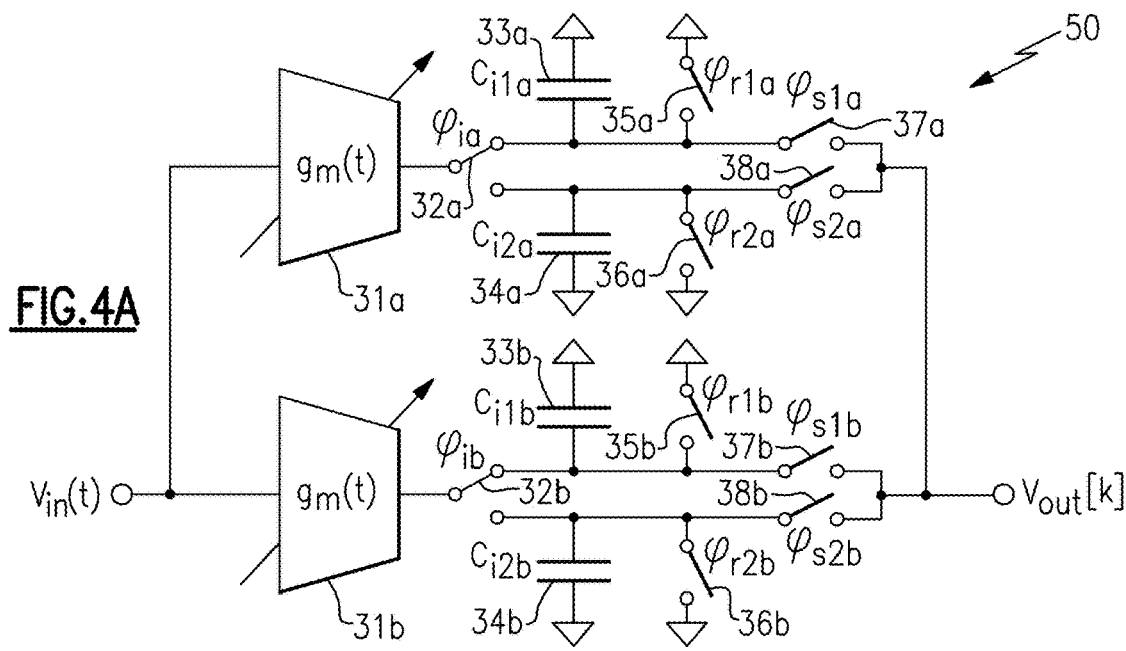
FIG. 4A is a schematic diagram of an analog FIR filter according to another embodiment.
Figure 4B:
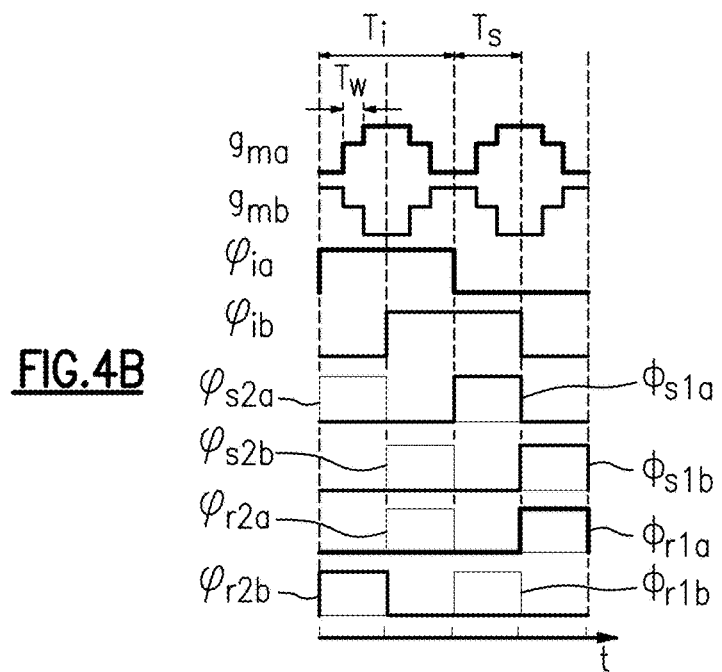
FIG. 4B is one example of a timing diagram for the analog FIR filter of FIG. 4A.
Figure 4C:
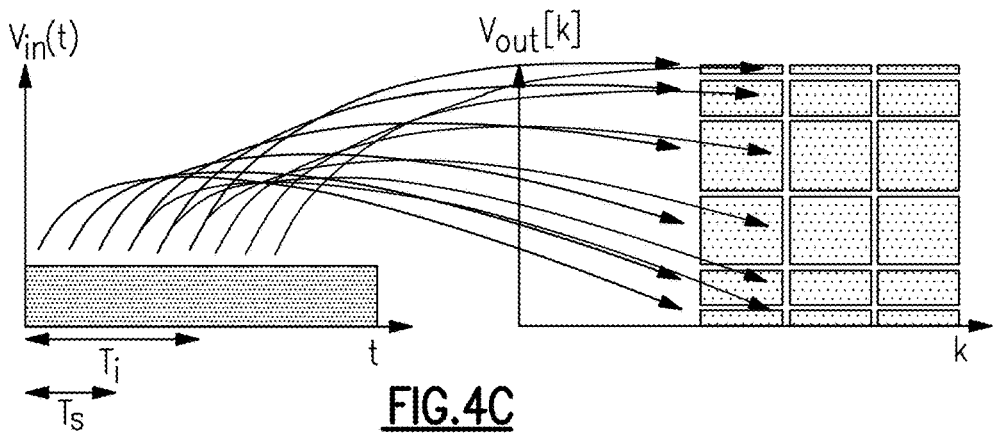
FIG. 4C is one example of graphs depicting operation of the analog FIR filter of FIG. 4A.

FIG. 4A is a schematic diagram of an analog FIR filter 50 according to another embodiment. FIG. 4A is one example of a timing diagram for the analog FIR filter 50 of FIG. 4A. FIG. 4C is one example of graphs depicting operation of the analog FIR filter 50 of FIG. 4A.

In the illustrated embodiment, the analog FIR filter 50 includes a first controllable transconductance circuit 31a, a second controllable transconductance circuit 31b, a first integration path selection switch 32a (controlled by a first integration clock signal ($\varphi_{ia}$), a second integration path selection switch 32b (controlled by a second integration clock signal $\varphi_{ib}$), a first integration capacitor 33a ($C_{i1a}$), a second integration capacitor 34a ($C_{i2a}$), a third integration capacitor 33b ($C_{i1b}$), a fourth integration capacitor 34b ($C_{i2b}$), a first reset switch 35a (controlled by a first reset clock signal $\varphi_{r1a}$), a second reset switch 36a (controlled by a second reset clock signal $\varphi_{r2a}$), a third reset switch 35b (controlled by a third reset clock signal $\varphi_{r1b}$), a fourth reset switch 36b (controlled by a fourth reset clock signal ($\varphi_{r2b}$), a first output sampling switch 37a (controlled by a first output sampling clock signal $\varphi_{s1a}$), a second output sampling switch 38a (controlled by a second output sampling clock signal $\varphi_{s2a}$), a third output sampling switch 37b (controlled by a third output sampling clock signal ($\varphi_{s1b}$), and a fourth output sampling switch 38b (controlled by a fourth output sampling clock signal $\varphi_{s2b}$).

The analog FIR filter 50 of FIG. 4A is similar to the analog FIR filter 40 of FIG. 3A, except the analog FIR filter 50 includes two instantiations of the analog FIR filter circuitry branches of FIG. 3A, which operate with interleaved timing. By interleaving two or more branches of analog FIR filter circuitry, output sampling rate can be increased. Although an example with interleaving of two branches is depicted, an analog FIR filter can also be implemented to include three or more branches of analog FIR filter circuitry that are time-interleaved.

For example, by interleaving m branches of analog FIR filter circuitry, an output sampling rate $f_s$ (corresponding to $1/T_s$) is increased relative to an integration period $T_i$, as set forth in Equation 1 below.

$$f_s = \frac{m}{T_i}, m = 1, 2, 3, \ldots \quad \text{Equation 1}$$

As shown in the example of FIG. 4C, an output voltage sample of the output voltage $v_{out}[k]$ is based on N charge contributions, where N is the number of filter taps and is related to the integration period $T_i$ and the weight updated period $T_w$ by $N=T_i/T_w$. The individual charge contributions become available at time instances t given in Equation 2 below.

$$t=nT_w, n = \ldots, -1, 0, 1, \quad \text{Equation 2}$$

Furthermore, the individual charge contributions q[n] are given by Equation 3 below, where $g_m(nT_w)/\overline{g_m}$ is the time-dependent FIR coefficient and $\overline{g_m}$ is the average transconductance.

$$q[n]=\overline{g_m}w[n]\int_{(n-1)T_w}^{nT_w}v_{in}(t)dt \quad \text{Equation 3}$$

The output voltage samples are available at time t given by Equation 4 below.

$$t = kT_s = k\frac{NT_w}{m}, k = \ldots, -1, 0, 1, \ldots \quad \text{Equation 4}$$

The output voltage samples include the sum of N charge contributions during an integration period, and thus the output voltage $v_{out}[k]$ can be represented using Equation 5 below.

$$v_{out}[k] = \frac{1}{C_i}\sum_{a=0}^{N-1} q[kN - a] \quad \text{Equation 5}$$

Accordingly, the input voltage $v_{in}(t)$ is thus integrated over time $T_w$, sampled at time $nT_w$, weighted by an FIR filter coefficient, summed, and sampled at $kT_s$.

The output frequency spectrum $S_{out}(f)$ can be derived from the input frequency spectrum $S_{in}(f)$ by taking a Fourier transform of Equations 3 and 5. Equation 6 below provides this expression.

$$S_{out}(f) = \sum_{k=-\infty}^{+\infty} H(f - kf_s)S_{in}(f - kf_s) \quad \text{Equation 6}$$

Furthermore, H(f) is given by Equation 7 below, where $w_a=w[N-a]$ for $a=0, 1, 2, \ldots N-1$.

$$H(f) = \underbrace{\frac{\overline{g_m}T_i}{C_i}}_{gain}\underbrace{\text{sinc}\left(\frac{f}{f_w}\right)e^{-j\pi\frac{f}{f_w}}}_{windowed \int}\underbrace{\sum_{a=0}^{N-1} w_a z^{-a}\Big|_{z=e^{j2\pi\frac{f}{f_w}}}}_{FIR filter} \quad \text{Equation 7}$$

With respect to Equation 7, three components can be distinguished: a gain component, a windowed integration component and a FIR filter component. The FIR filter component provides very selective filtering with a sharp filter transition and can be designed to have linear phase. Additionally, the windowed integration acts as a pre-filter, attenuating the FIR filter aliases at integer multiples of $f_w$. The gain is determined by $\overline{g_m}T_i/C_i$, which has PVT sensitivity that can be compensated for. Furthermore, the normalized analog FIR filter transfer function is controlled based on $g_m$ ratios and clock frequencies, which have low PVT variation.

Figure 5:
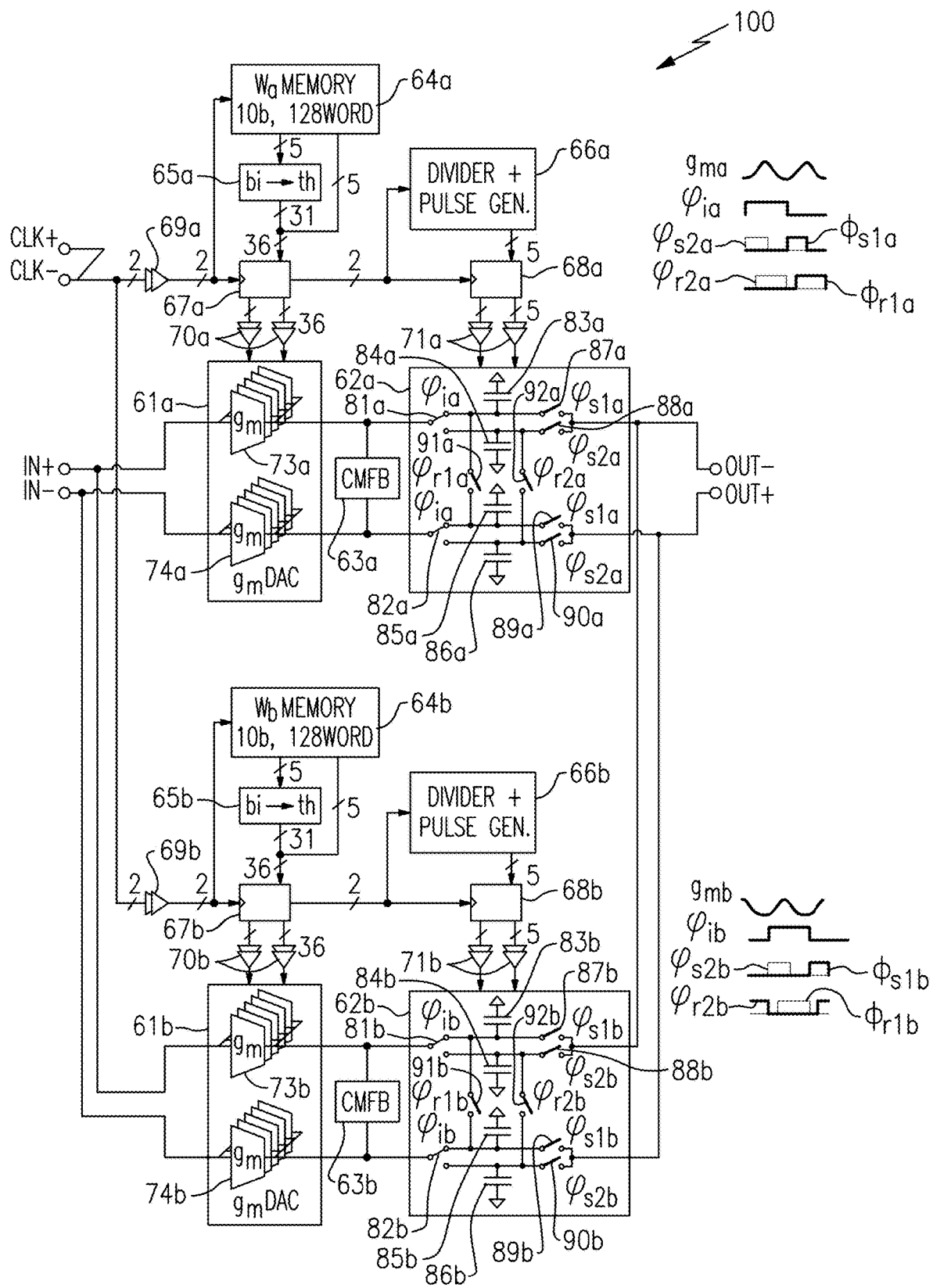
FIG. 5 is a schematic diagram of an analog FIR filter according to another embodiment.

FIG. 5 is a schematic diagram of an analog FIR filter 100 according to another embodiment. The analog FIR filter 100 includes a first differential transconductance DAC 61a, a second differential transconductance DAC 61b, a first differential switched integration circuit 62a, a second differential switched integration circuit 62b, a first common-mode feedback (CMFB) circuit 63a, a second CMFB circuit 63b, a first memory 64a (10 bit, 128 word, in this example), a second memory 64b (10 bit, 128 word, in this example), a first thermometer decoder 65a, a second thermometer decoder 65b, a first clock divider/pulse generator 66a, a second clock divider/pulse generator 66b, first DAC setting flip-flops 67a, second DAC setting flip-flops 67b, first clock pulse flip-flops 68a, second clock pulse flip-flops 68b, a first clock buffer 69a, a second clock buffer 69b, first DAC setting buffers 70a, second DAC setting buffers 70b, first clock pulse buffers 71a, and second clock pulse buffers 71b.

The analog FIR filter 100 also includes a differential clock terminal (CLK+CLK−), a differential input terminal (IN+, IN−), and a differential output terminal (OUT+, OUT−). Although the illustrated analog FIR filter 100 is implemented with differential signal paths to provide enhanced immunity to common-mode noise, the teachings herein are also applicable to analog FIR filters using single-ended signal paths or a combination of differential signal paths and single-ended single paths.

In the illustrated embodiment, the first memory 64a stores FIR filter coefficients for the first differential transconductance DAC 61a. In this example, a first portion of the bits (5 bits, in this example) are decoded by the first thermometer decoder 65a (to provide 31 bits, in this example), while a second portion of the bits (5 bits, in this example) are binary. The total combined bits (36 bits, in this example) are provided to the first DAC setting flip-flops 67a for retiming, and serve to control the transconductance setting of the first differential transconductance DAC 61a, which includes a first array of parallel $g_m$ cells 73a and a second array of parallel $g_m$ cells 74a. Likewise, the second memory 64b stores FIR filter coefficients for the second differential transconductance DAC 61b, which includes a first array of parallel $g_m$ cells 73b and a second array of parallel $g_m$ cells 74b.

With continuing reference to FIG. 5, the first clock divider/pulse generator 66a processes the differential clock signal to generate timing pulses suitable for controlling the first differential switched integration circuit 62a. The first clock pulse flip-flops 68a serve to synchronize the timing pulses relative to the differential clock signal. Likewise, the second clock divider/pulse generator 66b processes the differential clock signal to generate timing pulses suitable for controlling the second differential switched integration circuit 62b.

In the illustrated embodiment, the first differential switched integration circuit 62a is controlled by a first integration clock signal $\varphi_{in}$, a first reset clock signal $\varphi_{r1a}$, a second reset clock signal $\varphi_{r2a}$, a first output sampling clock signal $\varphi_{s1a}$, and a second output sampling clock signal $\varphi_{s2a}$. The second differential switched integration circuit 62b is controlled by a second integration clock signal $\varphi_{ib}$, a third reset clock signal $\varphi_{r1b}$, a fourth reset clock signal $\varphi_{r2b}$, a third output sampling clock signal $\varphi_{s1b}$, and a fourth output sampling clock signal $\varphi_{s2b}$. Example timing for the clock signals is annotated in FIG. 5 alongside example transconductance waveforms ($g_{ma}$, $g_{mb}$) for the first differential transconductance DAC 61a and the second differential transconductance DAC 61b. Although the transconductance waveforms appear continuous due to the high resolution of the DACs, the transconductance waveforms are associated with discrete changes to the settings of the DACs in accordance with the stored FIR filter coefficients.

In the illustrated embodiment, the first differential switched integration circuit 62a includes a first integration path selection switch 81a, a second integration path selection switch 82a, a first integration capacitor 83a, a second integration capacitor 84a, a third integration capacitor 85a, a fourth integration capacitor 86a, a first output sampling switch 87a, a second output sampling switch 88a, a third output sampling switch 89a, a fourth output sampling switch 90a, a first reset switch 91a, and a second reset switch 92a.

Additionally, the second differential switched integration circuit 62b includes a first integration path selection switch 81b, a second integration path selection switch 82b, a first integration capacitor 83b, a second integration capacitor 84b, a third integration capacitor 85b, a fourth integration capacitor 86b, a first output sampling switch 87b, a second output sampling switch 88b, a third output sampling switch 89b, a fourth output sampling switch 90b, a first reset switch 91b, and a second reset switch 92b.

The first CMFB circuit 63a serves to provide feedback to control the common-mode output voltage of the first differential transconductance DAC 61a. Providing common-mode feedback in this manner provides a number of advantages, such as suppressing changes in common-mode voltage arising from charge injection associated with transitions of the setting of the first differential transconductance DAC 61a and/or setting the common-mode voltage sufficiently low. Likewise, the second CMFB circuit 63b serves to provide feedback to control the common-mode output voltage of the second differential transconductance DAC 61b.

Additional details of the analog FIR filter 100 of FIG. 5 are similar to those of the analog FIR filter described above with respect to FIGS. 4A to 4C.

Figure 6:
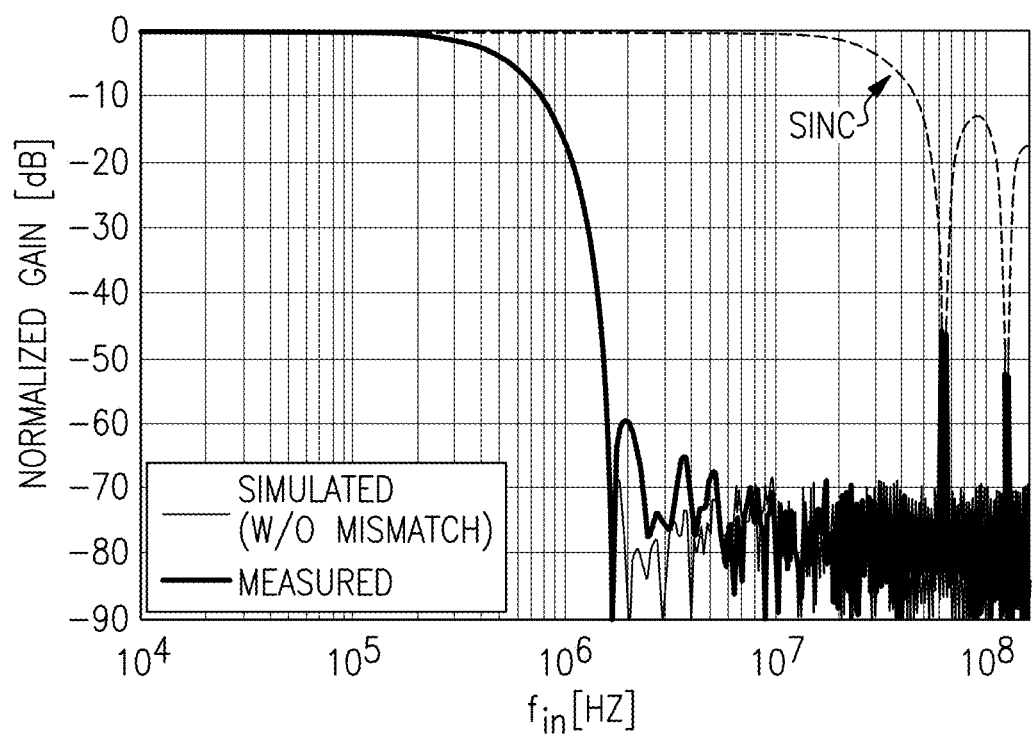
FIG. 6 is a graph of normalized gain versus frequency for one implementation of the analog FIR filter of FIG. 5.

FIG. 6 is a graph of normalized gain versus frequency for one implementation of the analog FIR filter 100 of FIG. 5. The graph includes plots for simulated (without mismatch) and measured normalized gain (in decibels) versus input frequency (in hertz).

As shown in FIG. 6, the transfer function of the analog FIR filter 100 is associated in part with a sinc function that serves to attenuate certain frequency components of the input signal.

Figure 7:
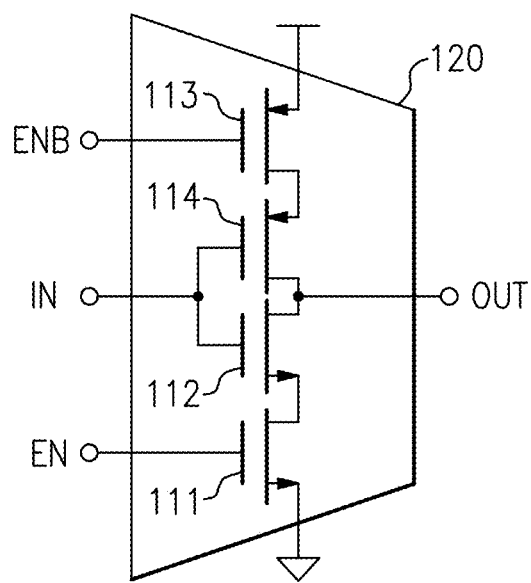
FIG. 7 is a schematic diagram of a selectable transconductance cell according to one embodiment.

FIG. 7 is a schematic diagram of a selectable transconductance cell 120 according to one embodiment. The selectable transconductance cell 120 includes a select n-type field effect transistor (NFET) 111, an input NFET 112, a select p-type field effect transistor (PFET) 113, and an input PFET 114.

The selectable transconductance cell 120 illustrates one embodiment of a transconductance cell for a transconductance DAC. For example, multiple instantiations of the selectable transconductance cell 120 can be placed in parallel to implement a transconductance DAC, with the selected combination of transconductance cells changing based on the particular FIR filter coefficients.

As shown in FIG. 7, the select PFET 113, the input PFET 114, the input NFET 112, and the select NFET 111 are electrically connected in series between a power supply voltage and a ground voltage. Additionally, the gates of the input PFET 114 and the input NFET 112 receives an input voltage from an input terminal IN, while the drains of the output PFET 114 and the output NFET 112 provide an output current to an output terminal OUT. The gate of the select NFET 111 receives an enable signal EN while the gate of the select PFET 113 receives a logically inverted enable signal ENB. The state of the enable signal EN/logically inverted enable signal ENB are chosen to activate the selectable transconductance cell 120 when desired.

In certain implementations, the select NFET 111 and the input NFET 112 are implemented as n-type metal oxide semiconductor (NMOS) transistors, while the select PFET 113 and the input PFET 114 are implemented as p-type metal oxide semiconductor (PMOS) transistors.

Figure 8A:
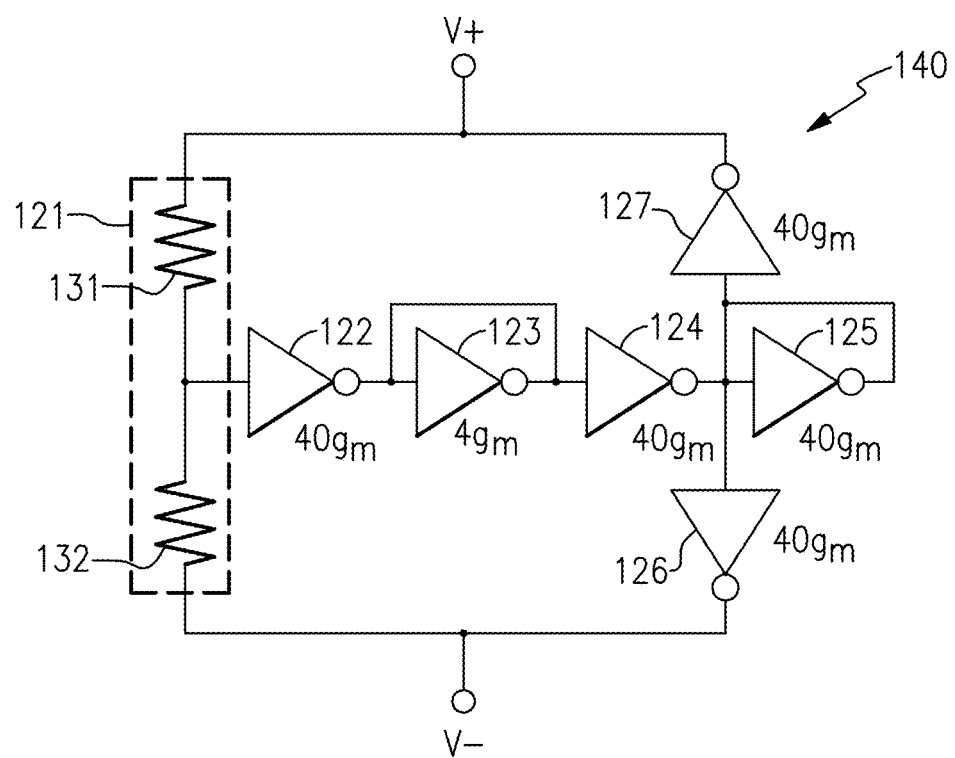
FIG. 8A is a schematic diagram of a common-mode feedback circuit according to one embodiment.

FIG. 8A is a schematic diagram of a common-mode feedback circuit 140 according to one embodiment. The common-mode feedback circuit 140 includes a voltage divider 121, a first transconductance circuit 122, a second transconductance circuit 123, a third transconductance circuit 124, a fourth transconductance circuit 125, a fifth transconductance circuit 126, and a sixth transconductance circuit 127.

The common-mode feedback circuit 140 illustrates one embodiment of a common-mode feedback circuit for a differential implementation of an analog FIR filter. For example, two instantiations of the common-mode feedback circuit 140 can be used to implement the CMFB circuits of FIG. 5. Although one embodiment of common-mode feedback circuitry is depicted, other implementations of common-mode feedback circuitry are possible.

As shown in FIG. 8A, the voltage divider 121 includes a first resistor 131 and a second resistor 132 in series between a non-inverted voltage terminal V+ and an inverted voltage terminal V− (which are connected across a differential output of a controllable transconductance circuit and serve to sense a common-mode voltage). The resistance of the first resistor 131 and the second resistor 132 can be substantially equal to provide a gain of about 0 to a differential input voltage component and a gain of about 1 to a common-mode input voltage component. The voltage divider 121 generates a sensed common-mode voltage at an output. Additionally, the first transconductance circuit 122, the second transconductance circuit 123, the third transconductance circuit 124, and the fourth transconductance circuit 125 are electrically connected in cascade starting from the output of the voltage divider 121. Furthermore, local feedback is provided from output to input for the second transconductance circuit 123 and the fourth transconductance circuit 125. The fifth transconductance circuit 126 includes an input connected to the output of the fourth transconductance circuit 125 and an output that drives the inverted voltage terminal V−. Additionally, the sixth transconductance circuit 127 includes an input connected to the output of the fourth transconductance circuit 125 and an output that drives the non-inverted voltage terminal V+.

In the illustrated embodiment, each of the transconductance circuits 122-127 are implemented using a parallel combination of enabled transconductance cells, such as the transconductance cell 120 of FIG. 7 with EN=high and ENB=low. One example of the number of parallel enabled transconductance cells for implementing a particular transconductance circuit is annotated in FIG. 8A.

Figure 8B:
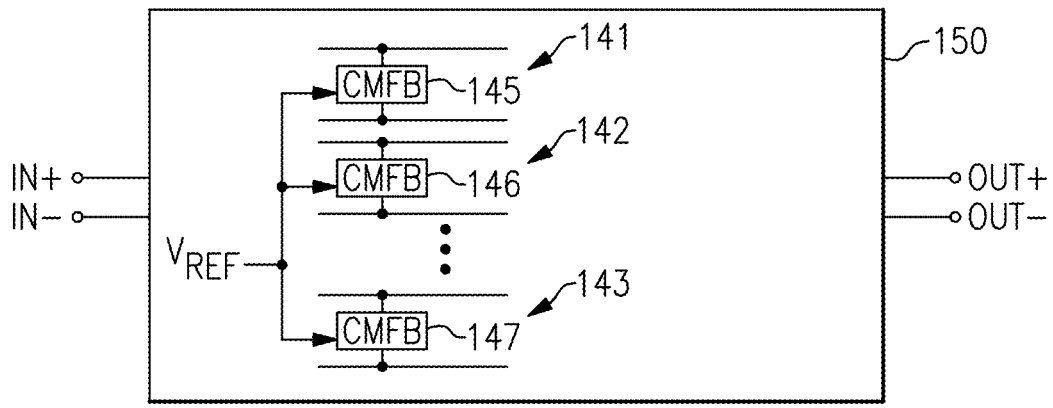
FIG. 8B is a schematic diagram of one embodiment of a time interleaved analog FIR filter with common-mode feedback using a shared reference voltage.

FIG. 8B is a schematic diagram of one embodiment of a time interleaved analog FIR filter 150 with common-mode feedback using a shared reference voltage $V_{REF}$. The time interleaved analog FIR filter 150 includes differential analog FIR filter circuit branches 141, 142, . . . 143, which can be implemented in accordance with any of the embodiments herein including, but not limited to, the differential analog FIR filter circuit branches of FIG. 5. Any number of analog FIR filter circuit branches can be included as indicated by the ellipsis.

As shown in FIG. 8B, the differential analog FIR filter circuit branches 141, 142, . . . 143 include common-mode feedback circuits 145, 146 . . . 147, respectively, which operate with the shared reference voltage $V_{REF}$. Using the shared reference voltage $V_{REF}$ aids in avoiding common-mode voltage offsets amongst the differential analog FIR filter circuit branches 141, 142, . . . 143.

Figure 8C:
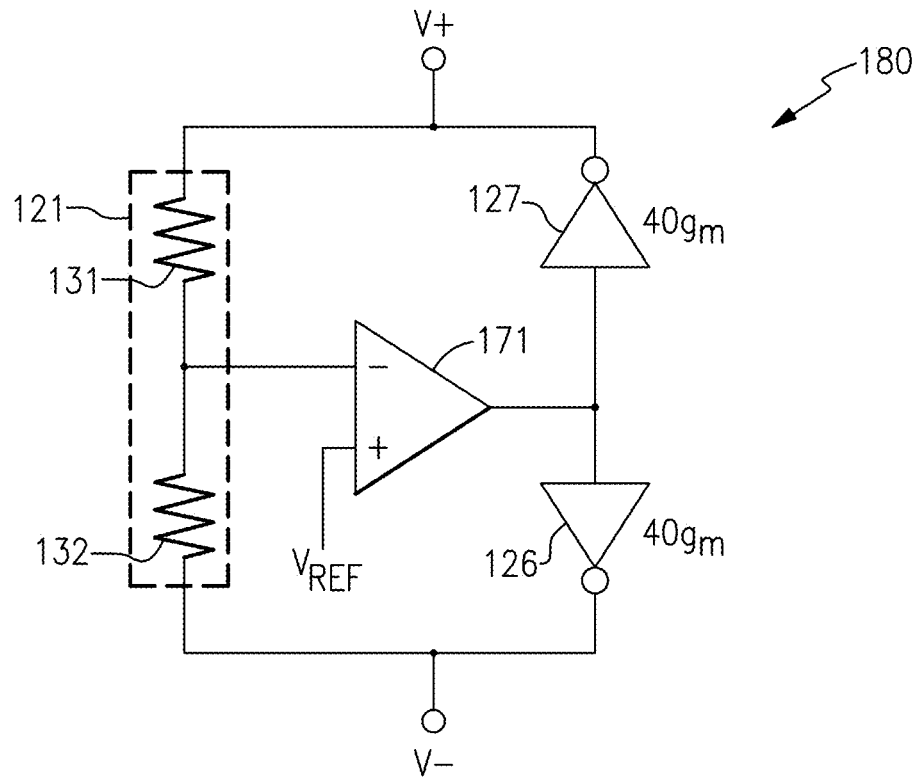
FIG. 8C is a schematic diagram of a common-mode feedback circuit according to another embodiment.

FIG. 8C is a schematic diagram of a common-mode feedback circuit 180 according to another embodiment. The common-mode feedback circuit 180 includes a voltage divider 121, differential amplifier 171, a transconductance circuit 126, and a transconductance circuit 127.

The common-mode feedback circuit 180 illustrates one embodiment of a common-mode feedback circuit for a differential implementation of an analog FIR filter. For example, multiple instantiations of the common-mode feedback circuit 140 can be used to implement the CMFB circuits of FIG. 5 or FIG. 8B. However, other implementations of common-mode feedback circuitry are possible.

As shown in FIG. 8C, the voltage divider 121 includes a first resistor 131 and a second resistor 132 in series between a non-inverted voltage terminal V+ and an inverted voltage terminal V− (which are connected across a differential output of a controllable transconductance circuit). The voltage divider 121 generates a sensed common-mode voltage at an output. Additionally, the differential amplifier 171 amplifies a difference between the sensed common-mode voltage and the shared reference voltage $V_{REF}$ (which can be shared across multiple CMFB circuits as shown in FIG. 8B), to generate an input voltage to the transconductance circuits 126 and 127 that drive the inverted voltage terminal V− and non-inverted voltage terminal V+, respectively. In the illustrated embodiment, each of the transconductance circuits 126 and 127 are implemented using a parallel combination of enabled transconductance cells, such as the transconductance cell 120 of FIG. 7 with EN=high and ENB=low. One example of the number of parallel enabled transconductance cells for implementing a particular transconductance circuit is annotated in FIG. 8C.

Figure 9:
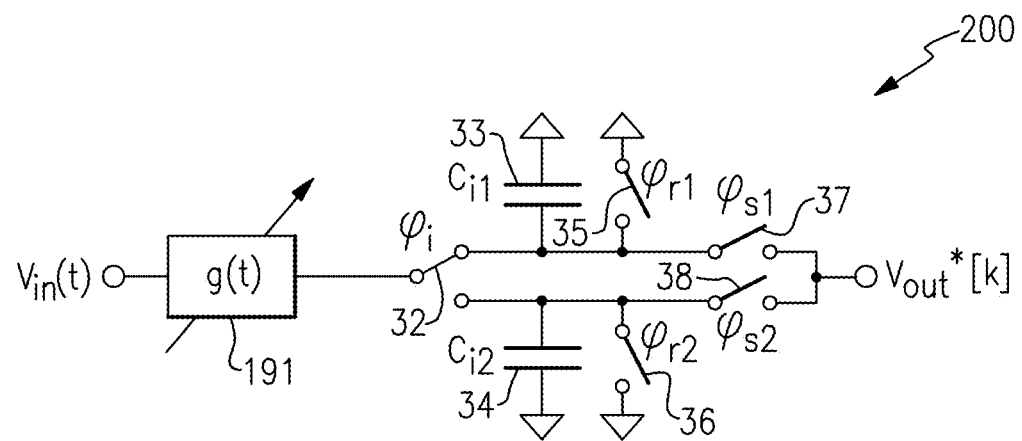
FIG. 9 a schematic diagram of an analog FIR filter according to another embodiment.

FIG. 9 a schematic diagram of an analog FIR filter 200 according to another embodiment. The analog FIR filter 200 includes a controllable resistor 141 (providing a conductance g(t) that is time varying), an integration path selection switch 32 (controlled by an integration clock signal $\varphi_i$), a first integration capacitor 33 ($C_{i1}$), a second integration capacitor 34 ($C_{i2}$), a first reset switch 35 (controlled by a first reset clock signal $\varphi_{r1}$), a second reset switch 36 (controlled by a second reset clock signal $\varphi_{s2}$), a first output sampling switch 37 (controlled by a first output sampling clock signal $\varphi_{s1}$), and a second output sampling switch 38 (controlled by a second output sampling clock signal $\varphi_{s2}$). The analog FIR filter 200 receives an input voltage $v_{in}(t)$, and generates an output voltage $v_{out}*[k]$.

The analog FIR filter 200 of FIG. 9 is similar to the analog FIR filter 40 of FIG. 3A, except that the analog FIR filter 200 of FIG. 9 includes the variable resistor 191 instead of the controllable transconductance circuit 31. The variable resistor 191 has a resistance that is changed over time based on the coefficient of the analog FIR filter in a manner similar to that described above with reference to FIGS. 3A to 3C. In certain implementations, the variable resistor 191 is implemented as a bank of selectable resistors (for instance, parallel circuit branches each including a switch and a resistor), with the selected combination of resistors chosen based on the analog FIR filter coefficients.

Any of the embodiments of analog FIR filters herein that include a controllable transconductance circuit can be modified to include a controllable resistor instead.

Figure 10:
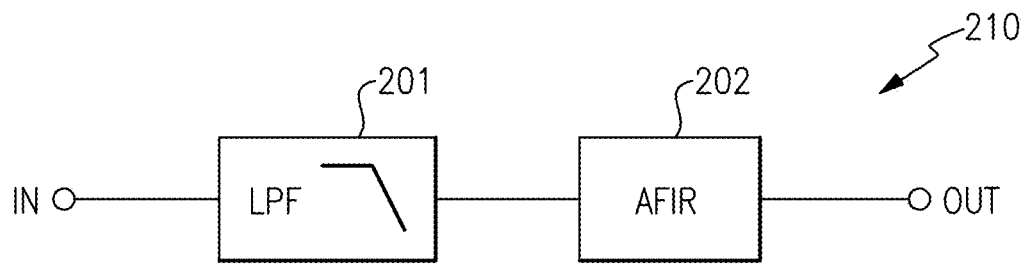
FIG. 10 is a schematic diagram of a filtering system according to one embodiment.

FIG. 10 is a schematic diagram of a filtering system 210 according to one embodiment. The filtering system 210 includes a cascade of a low pass filter (LPF) 201 and an analog FIR filter 202 between an input terminal IN and an output terminal OUT.

Including the LFP 201 before the input of the analog FIR filter 202 can serve as a pre-filter to suppress aliases. For example, to achieve low dynamic power consumption, any of the analog FIR filters can be operated with low clock rate and low output sampling rate $f_s$. Although operating with low output sampling rate $f_s$ can result in aliasing at integer multiples of the output sampling rate $f_s$, the analog FIR filter can be associated with a sinc function component (for example, see FIG. 6 and Equation 7) that serves to attenuate frequency components associated with aliasing. In certain implementations, the LPF 201 is included to further suppress such aliasing.

Figure 11A:
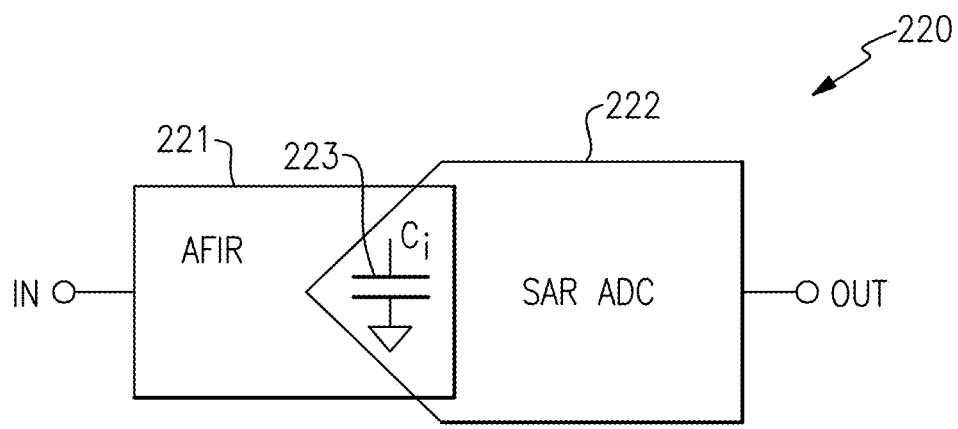
FIG. 11A is a schematic diagram of an analog-to-digital converter (ADC) system according to one embodiment.

FIG. 11A is a schematic diagram of an ADC system 220 according to one embodiment. The ADC system 220 includes an analog FIR filter 221, an ADC 222 (successive approximation or SAR, in this example), and a shared capacitor 223 ($C_i$) that serves as both an integration capacitor for the analog FIR filter 221 and as a sampling capacitor of the ADC 222.

Using the shared capacitor 223 serves to provide enhanced integration to reduce design size and/or cost.

Figure 11B:
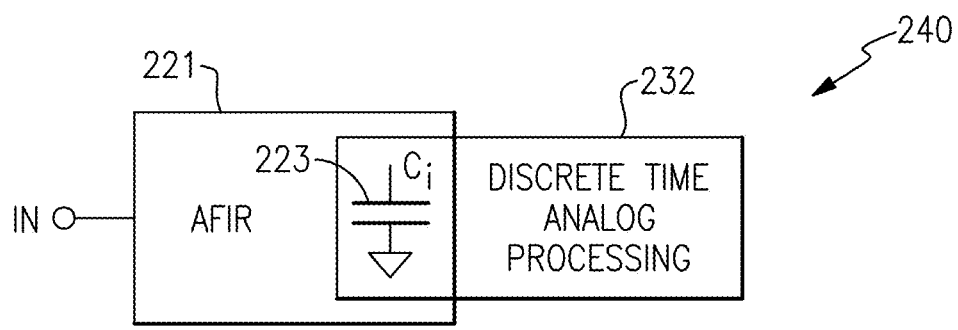
FIG. 11B is a schematic diagram of an analog signal processing system according to one embodiment.

FIG. 11B is a schematic diagram of an analog signal processing system 240 according to one embodiment. The analog signal processing system 240 includes an analog FIR filter 221, a discrete time analog processing circuit 232, and a shared capacitor 223 ($C_i$) that serves as both an integration capacitor for the analog FIR filter 221 and as a sampling capacitor of the discrete time analog processing circuit 232.

Figure 11C:
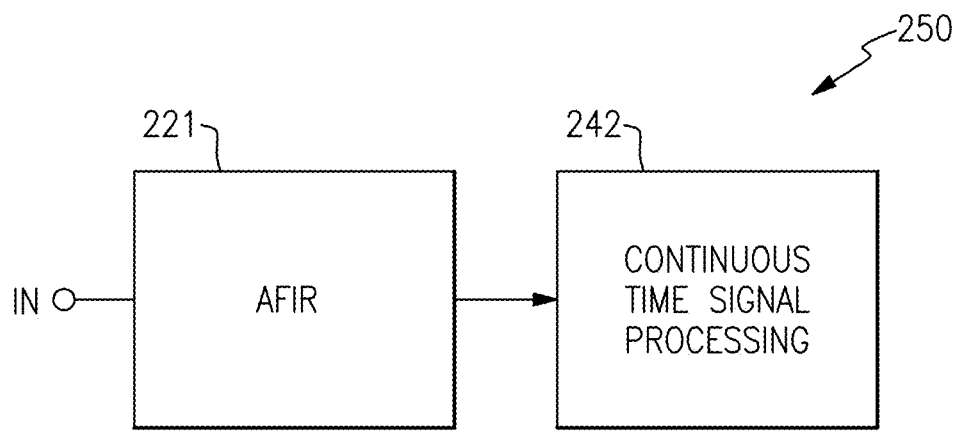
FIG. 11C is a schematic diagram of an analog signal processing system according to another embodiment.

FIG. 11C is a schematic diagram of an analog signal processing system 250 according to another embodiment. The analog signal processing system 250 includes an analog FIR filter 221 and a continuous time signal processing circuit 242 which can be, for example, an amplifier and/or filter.

Figure 12A:
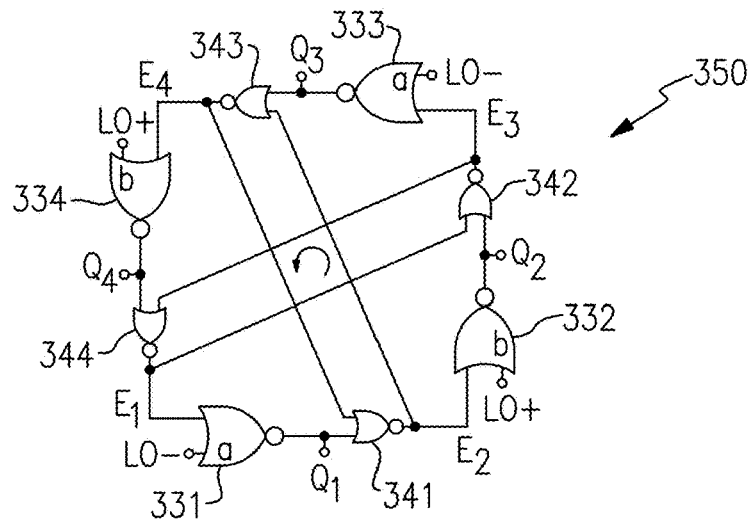
FIG. 12A is a schematic diagram of a quadrature divider according to one embodiment.

FIG. 12A is a schematic diagram of a quadrature divider 350 according to one embodiment. The quadrature divider 350 includes a group of gated NOR gates including a first gated NOR gate 331, a second gated NOR gate 332, a third gated NOR gate 333, and a fourth gated NOR gate 334. The quadrature divider 350 further includes a group of enabling NOR gates including a first enabling NOR gate 341, a second enabling NOR gate 342, a third enabling NOR gate 343, and a fourth enabling NOR gate 344. As shown in FIG. 12A, the quadrature divider 350 receives a differential LO signal including a non-inverted LO signal LO+ and an inverted LO signal LO−. Additionally, the quadrature divider outputs a first output clock signal $Q_1$, a second output clock signal $Q_2$, a third output clock signal $Q_3$, and a fourth output clock signal $Q_4$, which are provided on separate output terminals.

The quadrature divider 350 illustrates one embodiment of the quadrature divider 20 of FIG. 2. Thus, the first output clock signal $Q_1$, the second output clock signal $Q_2$, the third output clock signal $Q_3$, and the fourth output clock signal $Q_4$ serve to drive the inputs of a mixer used for frequency conversion (for example, the mixer 16 of FIG. 2 used for downconversion).

Figure 12B:
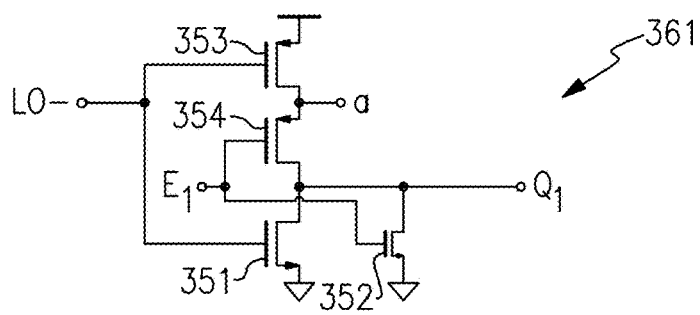
FIG. 12B is a schematic diagram of one implementation of a NOR gate for the quadrature divider of FIG. 12A.

FIG. 12B is a schematic diagram of one implementation of a NOR gate 361 for the quadrature divider 350 of FIG. 12A. The NOR gate 361 illustrates one embodiment of the first gated NOR gate 331 of FIG. 12A. The NOR gate 361 includes a first NFET 351, a second NFET 352, a first PFET 353, and a second PFET 354.

Figure 12C:
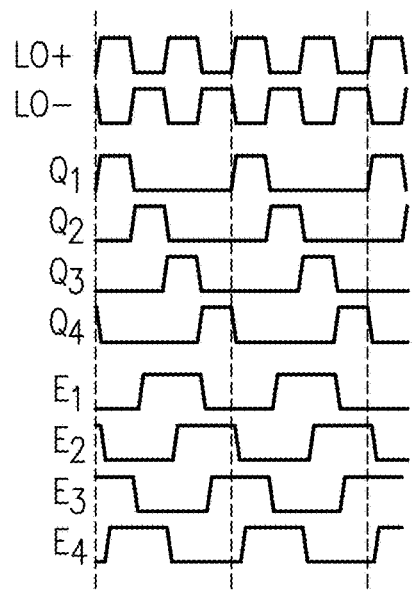
FIG. 12C is one example of a timing diagram for the quadrature divider of FIG. 12A.

FIG. 12C is one example of a timing diagram for the quadrature divider 350 of FIG. 12A.

With reference to FIGS. 12A-12C, the quadrature divider 350 operates to convert the differential LO signal with about 50% duty cycle to four quadrature output clock signals spaced apart by about 90° and having about half the input frequency and about 25% duty cycle.

The group of gated NOR gates serve as gated LO buffers. In certain implementations, the gated NOR gates have a larger size/drive strength than the enabling NOR gates, since the gated NOR gates can serve to generate the output clock signals, which can be directly provided to a mixer.

With continuing reference to FIGS. 12A-12C, the enabling NOR gates operate as a pair of latches (set/reset or SR latches) for enabling the appropriate output. In particular, the first gated NOR gate 331 receives a first enable signal $E_1$ from the fourth enabling NOR gate 344, the second gated NOR gate 332 receives a second enable signal $E_2$ from the first enabling NOR gate 341, the third gated NOR gate 333 receives a third enable signal $E_3$ from the second enabling NOR gate 342, and the fourth gated NOR gate 334 receives a fourth enable signal $E_4$ from the third enabling NOR gate 343.

When a particular gated NOR gate is enabled (by the corresponding enable signal being in a low state), the gated NOR gate acts as an inverting buffer to the LO clock signal.

For instance, an example of operation for the first output clock signal $Q_1$ is now provided. Initially, the first enable signal $E_1$ is low (enabling the first gated NOR gate 331), and a low value of the inverted LO signal LO− is passed to the first output clock signal $Q_1$ as a high value. Additionally, the high value of the first output clock signal $Q_1$ flips the latch associated with the $E_2/E_4$ (the first enabling NOR gate 341 and the third enabling NOR gate 343 connected as a first SR latch), thereby enabling the second gated NOR gate 332 and deactivating the fourth gated NOR gate 334.

Thus, the quadrature divider 350 operates in a windmill fashion associated with the rotation of the enable signals and the output clock signals.

In certain implementations, the output clock signals directly drive switches of a mixer without a need for any output clock buffers. Thus, the transistors associated with an LO− or LO+ input can be large (see, for example, the graphical depiction in FIG. 12B), while all other transistors can be small (for instance, minimum size). In this manner, very low power consumption is achieved while also realizing good phase noise and mismatch as only a single gate contributes to timing uncertainty.

Advantageously, the quadrature divider 350 operates without a need for start-up circuitry.

In certain implementations, a first top PFET (see, for example, the PFET 353 of FIG. 12B) is shared by the first gated NOR gate 331 and the third gated NOR gate 333, while a second top PFET is shared by the second gated NOR gate 332 and the fourth gated NOR gate 334. This sharing is indicated by the 'a' and 'b' shared node notations shown in FIG. 12A. By sharing the PFET for rising edges, reduced power consumption is achieved.

Figure 13A:
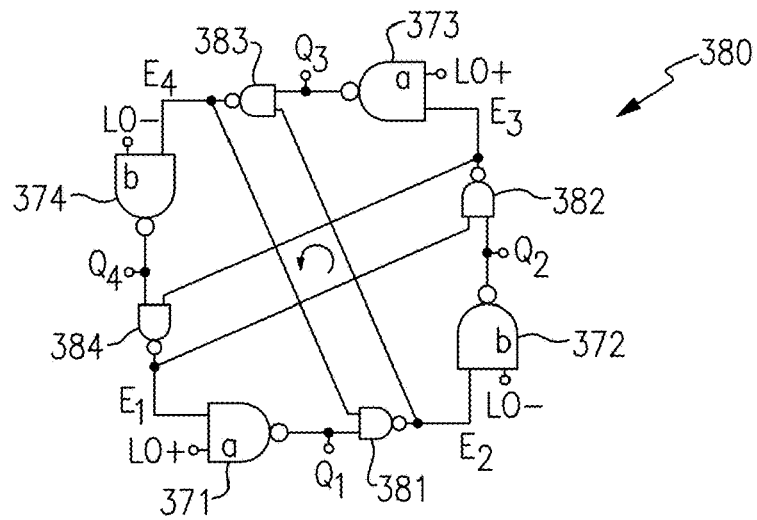
FIG. 13A is a schematic diagram of a quadrature divider according to another embodiment.

FIG. 13A is a schematic diagram of a quadrature divider 380 according to another embodiment. The quadrature divider 380 includes a group of gated NAND gates including a first gated NAND gate 371, a second gated NAND gate 372, a third gated NAND gate 373, and a fourth gated NAND gate 374. The quadrature divider 380 further includes a group of enabling NAND gates including a first enabling NAND gate 381, a second enabling NAND gate 382, a third enabling NAND gate 383, and a fourth enabling NAND gate 384. As shown in FIG. 13A, the quadrature divider 380 receives a differential LO signal including a non-inverted LO signal LO+ and an inverted LO signal LO−. Additionally, the quadrature divider outputs 380 a first output clock signal $Q_1$, a second output clock signal $Q_2$, a third output clock signal $Q_3$, and a fourth output clock signal $Q_4$, which are provided on separate output terminals. The quadrature divider 380 illustrates another embodiment of the quadrature divider 20 of FIG. 2.

The quadrature divider 380 of FIG. 13A is similar to the quadrature divider 350 of FIG. 12A, except that the quadrature divider 380 is implemented as a complementary divider using NAND gates instead of NOR gates.

Figure 13B:
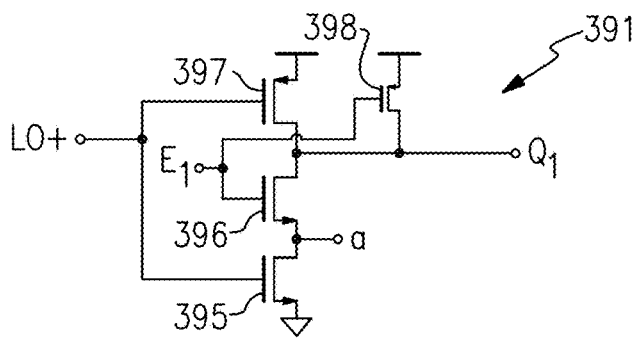
FIG. 13B is a schematic diagram of one implementation of a NAND gate for the quadrature divider of FIG. 13A.

FIG. 13B is a schematic diagram of one implementation of a NAND gate 391 for the quadrature divider 380 of FIG. 13A. The NAND gate 391 illustrates one embodiment of the first gated NAND gate 371 of FIG. 13A. The NAND gate 391 includes a first NFET 395, a second NFET 396, a first PFET 397, and a second PFET 398.

In certain implementations, a first bottom NFET (see, for example, the NFET 395 of FIG. 13B) is shared by the first gated NAND gate 371 and the third gated NAND gate 373, while a second bottom NFET is shared by the second gated NAND gate 372 and the fourth gated NAND gate 374. This sharing is indicated by the 'a' and 'b' shared node notations shown in FIG. 13A. By sharing the NFET for falling edges, reduced power consumption is achieved.

Figure 13C:
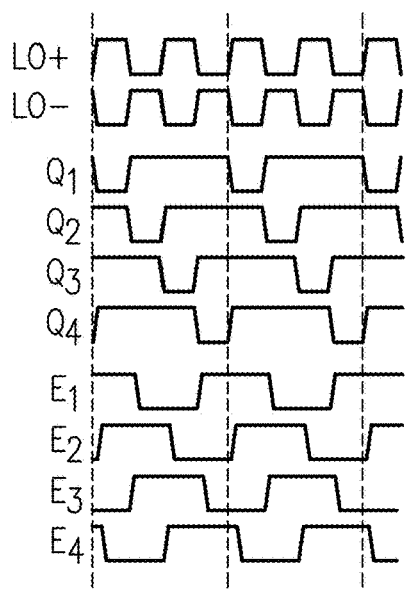
FIG. 13C is one example of a timing diagram for the quadrature divider of FIG. 13A.

FIG. 13C is one example of a timing diagram for the quadrature divider 380 of FIG. 13A.

With reference to FIGS. 13A-13C, the quadrature divider 380 operates to convert the differential LO signal with about 50% duty cycle to four quadrature output clock signals spaced apart by about 90° and having about half the input frequency and about 25% duty cycle. Operation of the quadrature divider 380 of FIG. 13A is similar to the quadrature divider 350 of FIG. 12A.

Figure 14:
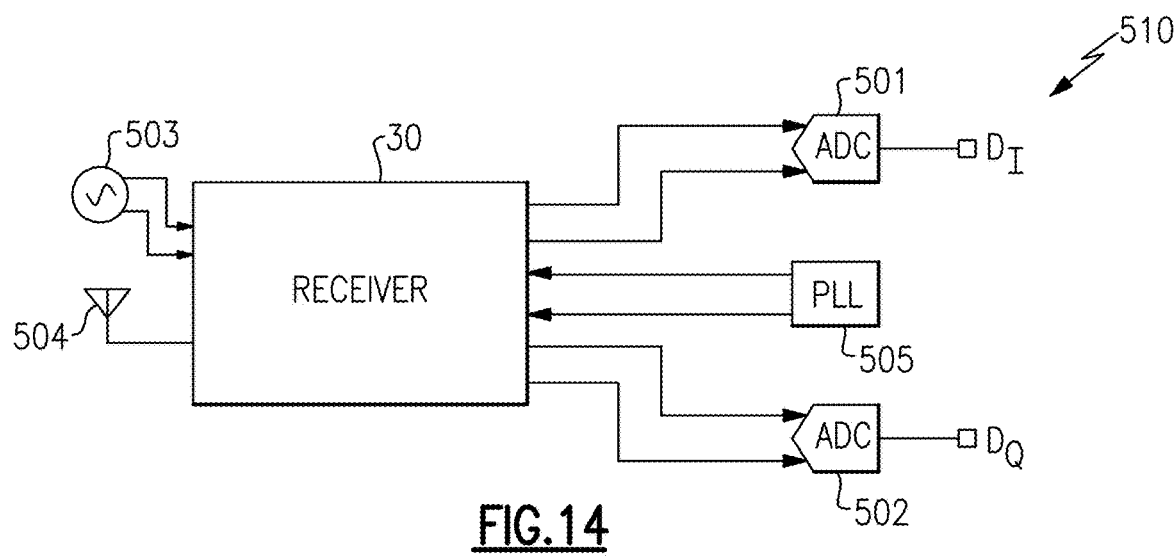
FIG. 14 is a schematic diagram of an RF communication system according to one embodiment.

FIG. 14 is a schematic diagram of an RF communication system 510 according to one embodiment. The RF communication system 510 includes the semiconductor die 30 including a receiver, as was described earlier with reference to FIG. 2. The RF communication system 510 further includes an I-path ADC 501, a Q-path ADC 502, an LO 503 (which is the output of a PLL, in certain implementations), an antenna 504, and a PLL 505.

In the illustrated embodiment the analog FIR filters on the semiconductor die 30 are on a separate chip relative to the I-path ADC 501, the Q-path ADC 502, the local oscillator 503, and the PLL 505.

Figure 15:
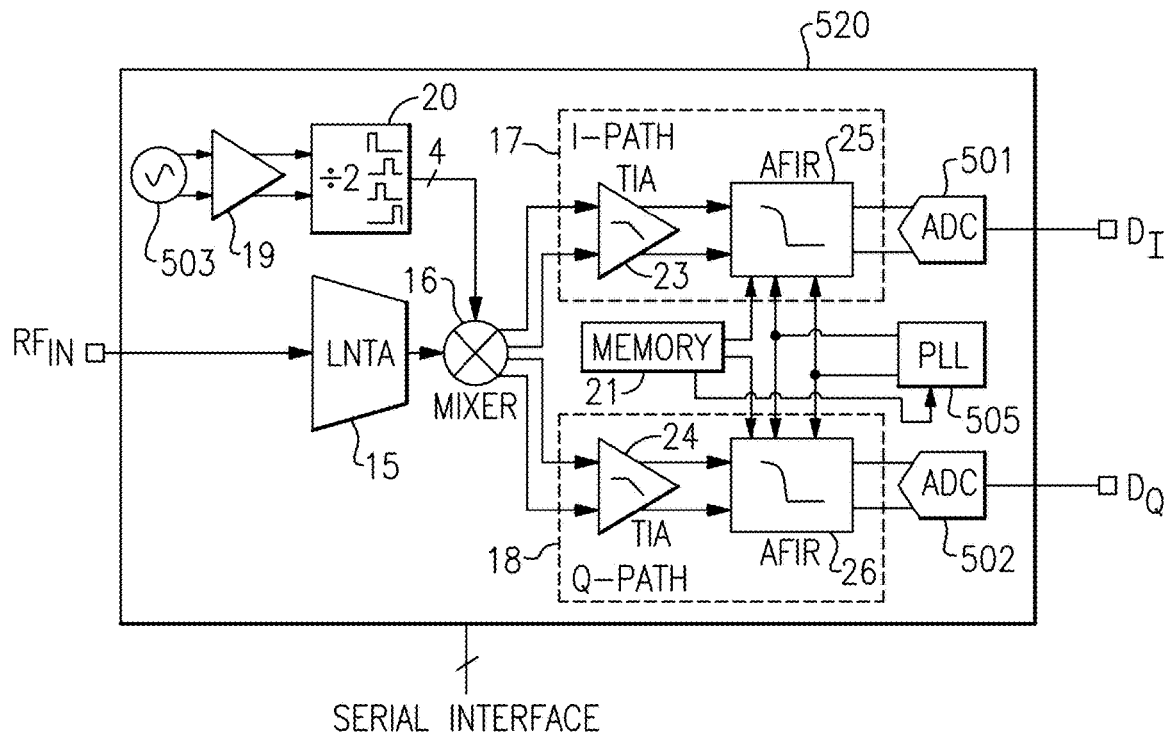
FIG. 15 is a schematic diagram of another embodiment of a semiconductor die including a receiver.

FIG. 15 is a schematic diagram of another embodiment of a semiconductor die 520 including a receiver. The semiconductor die 520 of FIG. 15 is similar to the semiconductor die 30 of FIG. 2, except that the semiconductor die 520 further includes the I-path ADC 501 the Q-path ADC 502, the local oscillator 503, and the PLL 505 integrated thereon.

Additionally, in FIG. 15, the memory 21 provides clock configuration data to the PLL 505 to thereby control the operating frequency of the clock signal provided to the analog FIR filters. Furthermore, the semiconductor die 520 includes a serial interface for programming FIR filter coefficients and/or clock configuration data into the memory 21.

Applications

Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical, automotive, radar, and aerospace applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

The invention claimed is:

1. A receiver with analog finite impulse response filtering, the receiver comprising:
    a mixer configured to downconvert a receive signal to generate a downconverted signal;
    an analog finite impulse response (FIR) filter configured to filter the downconverted signal to generate a filtered signal, wherein the analog FIR filter includes a controllable integrator having an integration current that is generated based on a plurality of filter coefficients of the analog FIR filter; and
    an analog-to-digital converter (ADC) configured to digitize the filtered signal.

2. The receiver of claim 1, wherein the analog FIR filter includes a plurality of filter circuit branches that operate with interleaved timing.

3. The receiver of claim 2, wherein the plurality of filter circuit branches are implemented differentially, each of the plurality of filter circuit branches including a common-mode feedback circuit operating with a shared reference voltage.

4. The receiver of claim 1, further comprising a low pass filter configured to provide pre-filtering to the downconverted signal prior to filtering by the analog FIR filter.

5. The receiver of claim 1, wherein a shared capacitor serves as an integration capacitor for the analog FIR filter and as a sampling capacitor for the ADC.

6. The receiver of claim 1, wherein the analog FIR filter includes a capacitor, and a controllable transconductance circuit configured to receive the downconverted signal and to provide the integration current to the capacitor over an integration period, wherein the analog FIR filter is configured to change a transconductance setting of the controllable transconductance circuit with a weight update period that is shorter than the integration period.

7. The receiver of claim 6, wherein the controllable transconductance circuit includes a transconductance digital-to-analog converter (DAC) including a plurality of selectable transconductance cells electrically connected in parallel and selectively activated based on the plurality of filter coefficients of the analog FIR filter.

8. The receiver of claim 6, wherein the controllable transconductance circuit is implemented differentially and includes a common-mode feedback circuit configured to control a common-mode output voltage of the controllable transconductance circuit to compensate for charge injection arising from changing the transconductance setting.

9. The receiver of claim 6, wherein the analog FIR filter further comprises an output sampling switch configured to connect the capacitor to an output terminal of the analog FIR filter over an output sample period.

10. The receiver of claim 9, wherein the analog FIR filter includes a plurality of filter circuit branches that operate with interleaved timing, wherein the output sample period is shorter than the integration period.

11. The receiver of claim 1, further comprising a quadrature divider configured to receive a differential local oscillator (LO) signal and to provide the mixer with four output clock signals having a quadrature phase relationship, wherein the quadrature divider includes a first group of four logic gates each configured to generate a respective one of the four output clock signals and a second group of four logic gates each configured to gate a corresponding one of the first group of four logic gates.

12. The receiver of claim 11, wherein a first pair of logic gates of the second group of four logic gates operate as a first latch, and wherein a second pair of logic gates of the second group of logic gates operate as a second latch, wherein each logic gate of the first group of logic gates receives either a non-inverted component of the differential LO signal or an inverted component of the differential LO signal.

13. The receiver of claim 11, wherein the differential LO signal has a duty cycle of about 50 percent and an input frequency, wherein each of the four output clock signals has a duty cycle of about 25 percent and a frequency that is about one-half the input frequency.

14. The receiver of claim 11, wherein the first group of logic gates and the second group of logic gates are implemented as either 2-input NAND gates or 2-input NOR gates.

15. A method of receiving signals, the method comprising:
downconverting a receive signal to generate a downconverted signal using a mixer;
filtering the downconverted signal to generate a filtered signal using an analog finite impulse response (FIR) filter, including generating an integration current based on a plurality of filter coefficients of the analog FIR filter; and
digitizing the filtered signal using an analog-to-digital converter (ADC).

16. The method of claim 15, further comprising operating a plurality of filter circuit branches of the analog FIR filter with interleaved timing.

17. The method of claim 15, wherein filtering the downconverted signal includes providing the integration current to a capacitor over an integration period using a controllable transconductance circuit, and changing a transconductance setting of the controllable transconductance circuit with a weight update period that is shorter than the integration period.

18. The method of claim 17 wherein the controllable transconductance circuit includes a transconductance digital-to-analog converter (DAC) including a plurality of selectable transconductance cells electrically connected in parallel, wherein filtering the downconverted signal further includes selectively activating the plurality of selectable transconductance cells based on the plurality of filter coefficients.

19. The method of claim 15, further comprising generating four output clock signals for the mixer from a differential local oscillator (LO) signal using a quadrature divider, including using a first group of four logic gates to generate the four output clock signals, and using a second group of four logic gates to gate the first group of four logic gates.

20. A semiconductor die comprising:
a memory configured to store a plurality of filter coefficients;
an analog finite impulse response (FIR) filter configured to filter an input signal to generate a filtered signal, wherein the analog FIR filter includes a controllable integrator having an integration current that is generated based on the plurality of filter coefficients; and
an analog-to-digital converter (ADC) configured to digitize the filtered signal.

* * * * *